(12) United States Patent
Lum et al.

(10) Patent No.: US 11,621,364 B2
(45) Date of Patent: Apr. 4, 2023

(54) ISOLATION DEVICE AND METHOD OF TRANSMITTING A SIGNAL ACROSS AN ISOLATION MATERIAL USING WIRE BONDS

(71) Applicant: MPICS INNOVATIONS PTE. LTD, Singapore (SG)

(72) Inventors: Kok Keong Richard Lum, Singapore (SG); Hong Sia Tan, Singapore (SG)

(73) Assignee: MPICS INNOVATIONS PTE. LTD, Singapore (SG)

(*) Notice: Subject to any disclaimer, the term of this patent is extended or adjusted under 35 U.S.C. 154(b) by 394 days.

(21) Appl. No.: 16/936,123

(22) Filed: Jul. 22, 2020

(65) Prior Publication Data
US 2022/0029043 A1   Jan. 27, 2022

(51) Int. Cl.
| | |
|---|---|
| H01L 31/173 | (2006.01) |
| H01L 23/00 | (2006.01) |
| H01L 31/02 | (2006.01) |
| H01L 25/065 | (2023.01) |
| H01L 23/64 | (2006.01) |
| H02J 50/10 | (2016.01) |

(52) U.S. Cl.
CPC .......... *H01L 31/173* (2013.01); *H01L 23/645* (2013.01); *H01L 24/48* (2013.01); *H01L 24/49* (2013.01); *H01L 25/0655* (2013.01); *H01L 31/02005* (2013.01); *H02J 50/10* (2016.02); *H01L 2224/48091* (2013.01); *H01L 2224/48225* (2013.01); *H01L 2224/48245* (2013.01); *H01L 2224/4903* (2013.01); *H01L 2924/3025* (2013.01)

(58) Field of Classification Search
CPC ..... H01L 31/173; H01L 23/645; H01L 24/48; H01L 24/49; H01L 25/0655; H01L 31/02005; H01L 2224/48091; H01L 2224/48225; H01L 2224/48245; H01L 2224/4903; H01L 2924/3025; H01L 2224/48011; H01L 2224/49095; H01L 2224/49173; H01L 2224/49175; H01L 2224/49176; H01L 2224/49179; H02J 50/10; H04B 1/04; H04B 1/16; G01R 15/18

See application file for complete search history.

(56) References Cited

U.S. PATENT DOCUMENTS

| | | | |
|---|---|---|---|
| 9,978,696 B2 * | 5/2018 | Bernardinis | H01L 23/49575 |
| 10,074,713 B1 * | 9/2018 | Briano | H01L 25/18 |
| 10,276,490 B2 * | 4/2019 | Lum | H01L 29/0642 |
| 2015/0280785 A1 * | 10/2015 | Brauchler | H04B 5/005 |
| | | | 438/3 |

* cited by examiner

*Primary Examiner* — Seung H Lee
(74) *Attorney, Agent, or Firm* — Sheridan Ross P.C.

(57) ABSTRACT

An isolation system and isolation device are disclosed. An illustrative isolation device is disclosed to include a transmitter circuit, a detector circuit, a first wire bond, and a second wire bond. The detector circuit is configured to generate a first current in accordance with a first signal. The first wire bond is configured to receive the first current from the transmitter circuit to generate a magnetic flux. The second wire bond is configured to receive the magnetic flux. An induced current in the second wire bond is then detected in the detector circuit. The detector circuit is configured to generate a reproduced first signal, as an output of the detector circuit.

19 Claims, 10 Drawing Sheets

ISOLATION DEVICE AND METHOD OF TRANSMITTING A SIGNAL ACROSS AN ISOLATION MATERIAL USING WIRE BONDS

BACKGROUND

The present disclosure is generally directed toward electronic isolation and devices for accommodating the same.

Electronic isolation systems are electronic devices driven by different power domains and, thus, unsuitable to be electrically connected. However, the electronic devices operated in different power domains have to communicate in order to function as a control system. For this purpose, galvanic isolators may be used. Galvanic isolators are devices that allow exchanges of signals without any direct electrical connections. Optocouplers and capacitive isolators are commonly used isolators. Optocouplers convert electrical signals into light signals in order to transmit across an isolation material. In contrast, capacitive couplers transmit electrical signals from a first circuit to a second circuit that is electrically isolated through electric fields.

BRIEF DESCRIPTION OF THE DRAWINGS

Illustrative embodiments by way of examples, not by way of limitation, are illustrated in the drawings. Throughout the description and drawings, similar reference numbers may be used to identify similar elements. The drawings may be simplified illustrative views rather than precise engineering drawings. The drawings are for illustrative purposes to assist understanding and may not necessarily be drawn per actual scale.

DETAILED DESCRIPTION

The following description is not intended to limit the scope, applicability, or configuration of the claims. Instead, the description is written to provide those skilled in the art with an enabling description for implementing the described embodiments. It is understood that various changes may be made in the function and arrangement of elements without departing from the spirit and scope of the appended claims.

Various aspects of the present disclosure will be described herein with reference to drawings that are schematic illustrations of idealized configurations. As such, variations from the shapes of the illustrations as a result, for example, manufacturing techniques and/or tolerances, are to be expected. Thus, the various aspects of the present disclosure presented throughout this document should not be construed as limited to the particular shapes of elements illustrated. It is understood that when an element such as a region, structure, substrate, or the like, is referred to as being "on" another element, it can be directly on the other element or intervening elements may also be present. In contrast, when an element is referred to as being "directly on" another element, there are no intervening elements present. Similarly, the term "connected to" can be interpreted as "connected directly to" or "being connected to with intervening elements." As used herein, the singular forms "a," "an," and "the" are intended to include the plural forms as well, unless the context indicates otherwise.

Figure 1:
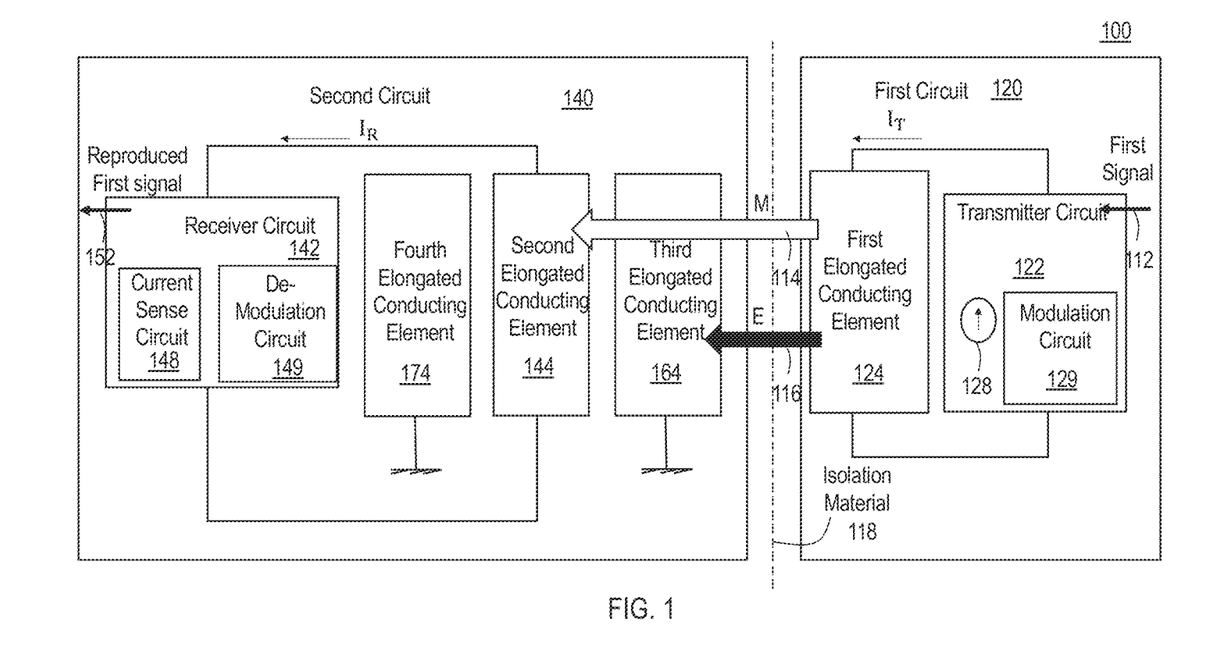
FIG. 1 shows an illustrative block diagram of a device or an isolation system.

FIG. 1 shows an illustrative block diagram of a device 100. The device 100 may be configured to transmit a first signal 112 from a first circuit 120 to a second circuit 140. The device 100 comprises a transmitter circuit 122, a receiver circuit 142, a first elongated conducting element 124, a second elongated conducting element 144, an optional third elongated conducting element 164, and an optional fourth elongated conducting element 174. The transmitter circuit 122 is configured to generate a first current $I_T$ in accordance with the first signal 112. For this purpose, the transmitter circuit 122 comprises a current generator 128 and optionally, a modulation circuit 129. The current generator 128 may comprise a current source circuit to generate the first current $I_T$. On some occasions, the first signal 112 may be modulated with a modulation scheme to improve signal robustness prior to transmission. A suitable modulation scheme may be a frequency modulation, code division modulation, or other modulation schemes that are designed to reject noise.

The first current $I_T$ is then allowed to flow through the first elongated conducting element 124 so as to generate a magnetic field 114 when the first current flows through the first elongated conducting element 124. The second elongated conducting element 144 is positioned adjacent to the first elongated conducting element 124 to receive the magnetic field 114. The second elongated conducting element 144 is configured to generate an induced current $I_R$ when the magnetic field 114 is received. The receiver circuit 142 configured to receive the induced current $I_R$, as an input, and configured to generate a reproduced first signal 152 as an output of the receiver circuit 142. The receiver circuit 142 may comprise a current sense circuit 148 and a demodulation circuit 149. The device 100 may optionally comprise an isolation material 118 disposed between the first circuit 120 and the second circuit 140 such that the first circuit 120 and the second circuit 140 are electrically isolated. The isolation material 118 may be air or an encapsulant such as silicone or epoxy. The first circuit 120 may comprise a semiconductor die, and therefore, the first circuit 120 may be referred to as the first die or the transmitter die. Similarly, the second circuit 140 may be referred to as the second die, or the receiver die. The term 'transmitter die,' or 'receiver die' are used interchangeably with the first die and the second die to facilitate the understanding of the embodiment when a transmission is described. However, the term should not be interpreted narrowly.

An electric field 116 may be generated by the first elongated conducting element 124 when the first elongated conducting element 124 is electrically connected. The electric field 116 may have an undesirable effect on the second elongated conducting element 144. Ideally, the induced current $I_R$ generated from the magnetic field 114 shall not be affected by the electric field 116. In reality, this may not be the case. The induced current $I_R$ may respond differently to the magnetic field 114 and the electric field 116. Therefore, the effect of the electric field 116 is undesirable and is to be reduced as much as possible.

Figure 2A:
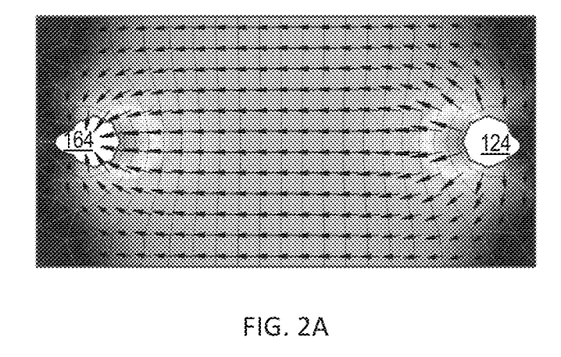
FIG. 2A shows an electric field simulation of two conducting elements.
Figure 2B:
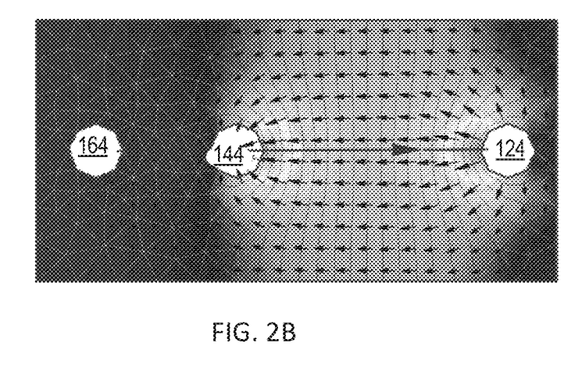
FIG. 2B shows an electric field simulation of two conducting elements with a protective shield.

One way to achieve this is by having an elongated shape for the first elongated conducting element 124 and the second elongated conducting element 144. Due to the elongated shape, the first elongated conducting element 124 and the second elongated conducting element 144 are less susceptible to the electric field. A second way to minimize the electric field 116 is by having a third elongated conducting element 164 that function as a single-ended shield disposed between the first elongated conducting element 124 and the second elongated conducting element 144. This aspect is explained in the simulation result shown in FIG. 2A, and FIG. 2B. FIG. 2A is a simulation result showing electric field 116 surrounding the first elongated conducting element 124 and the second elongated conducting element 144. FIG. 2B is a similar simulation but with the third elongated conducting element 164. The electric field 116 terminates at the third elongated conducting element 164.

The third elongated conducting element 164 extends substantially in parallel with the first elongated conducting element 124 and the second elongated conducting element 144. The third elongated conducting element 164 is grounded on one end so as to shield the second elongated conducting element 144 from the electric field 116 generated from the first elongated conducting element 124. The third elongated conducting element 164 comprises a first end connected directly or indirectly to an insulating material, and a second end connected to an electrically conducting structure to ground. As one end of the third elongated conducting element 164 remains open-ended, there is no electric current that flows through the third elongated conducting element 164. In this way, the third elongated conducting element 164 is prevented from generating an additional magnetic field that may have affected the second elongated conducting element 144.

During a high voltage attack, the high voltage induced on the second circuit 140 may be diverted through the third elongated conducting element 164 directly to ground without reaching any sensitive circuits or devices in the second circuit 140. For a high voltage system, this arrangement may improve the breakdown voltage between the first circuit 120 and the second circuit 140.

However, a small amount of current may flow between the ground and the third elongated conducting element 164 when the electric field 116 is imposed. The small amount of current may generate an undesirable magnetic field onto the second elongated conducting element 144. The undesirable magnetic field may be substantially reduced or canceled off by having an optional fourth elongated conducting element 174. The fourth elongated conducting element 174 is grounded on one end. The fourth elongated conducting element 174 is configured to shield the second elongated conducting element 144 from the electric field 116. The third elongated conducting element 164 and the fourth elongated conducting element 174 are configured such that an additional magnetic field generated from the fourth elongated conducting element, as detected at the second elongated conducting element 144, cancels out an additional magnetic field generated from the third elongated conducting element 164 when a similar electric current flow through the third elongated conducting element 164 and the fourth elongated conducting element 174 respectively.

The first elongated conducting element 124 may comprise at least one or a combination of a wire-bond, a conducting trace of a printed circuit board, a lead frame, and a conducting trace within an integrated circuit. By way of examples, the subsequent embodiments illustrate implementations of the first elongated conducting element 124 and the second elongated conducting element 144 using wire bonds. It is to be noted that the elongated conducting elements 124, 144, 164, and 174 are not limited to wire bonds but may comprise lead frames, traces in a printed circuit board, or other elongated shape conducting structure.

Alternatively, the illustrative block diagram in FIG. 1 may form a portion of an isolation system 100. The isolation system 100 may be a portion of a solid-state lighting system and an electric vehicle charging system. The isolation system 100 comprises a transmitter circuit 120, a detector circuit 140, a first elongated structure 124, a second elongated structure 144, a third elongated structure 164, and a fourth elongated structure 174. The elongated structures 124, 144, 164, and 174 are electrically conductive and may be configured to generate a magnetic field 114. The third elongated structure 164 and the fourth elongated structure 174 may be optional. The transmitter circuit 120 is configured to generate a first current $I_T$ in accordance with a first signal 112. The first elongated structure 124 configured to receive the first current $I_T$ so as to generate a magnetic field 114 that correlates with the first current $I_T$. The second elongated structure 144 is coupled to the detector circuit 140 for receiving the magnetic field 114 from the first elongated structure 124 so as to generate an induced current $I_R$. The detector circuit 140 that is electrically isolated from the transmitter circuit 120. The detector circuit 140 is configured to receive the induced current $I_R$, as an input, and configured to generate a reproduced first signal 152 as an output of the detector circuit 140.

The third elongated structure 164 has a first end electrically connected to ground and a second end connected to an electrical isolation material. The third elongated structure 164 is configured to shield the second elongated structure 144 from the electric field 116 generated from the first elongated structure 124. The second elongated structure 144 is positioned between the third elongated structure 164 and the fourth elongated structure 174. The fourth elongated structure 174 has a first end electrically connected to ground and a second end electrically connected to an isolation material similar to the third elongated structure 164. The third elongated structure 164 and the fourth elongated structure 174 are configured such that magnetic fields caused by a current flow in each of the third elongated structure 164 and the fourth elongated structure 174 cancel out each other in the second elongated structure 144 which will be explained further in FIGS. 4A-FIG. 4G.

Figure 3A:
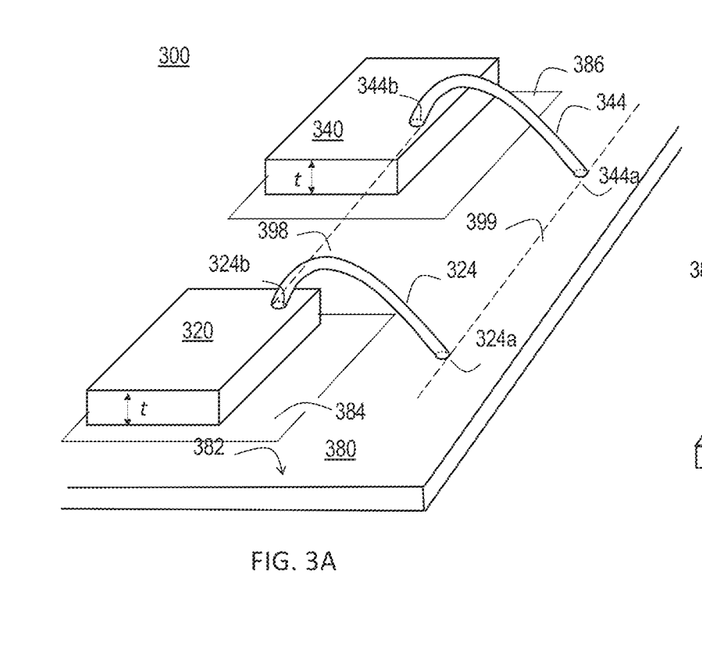
FIG. 3A shows a perspective view of an isolation device having two wire bonds.

FIG. 3A shows an electronic device 300. The electronic device 300 comprises a first die 320, a second die 340, a first wire bond 324, and a second wire bond 344. The wire bonds 324 and 344 are implementation examples of the elongated conducting elements 124 and 144 shown in FIG. 1, respectively. The first die 320 comprises a transmitter circuit 122, which may have a current generator 128 and a modulation circuit 129. The second die 340 may comprise a current sense circuit 148 and a demodulation circuit 149. The first die 320 and the second die 340 may be electrically isolated. The first die 320 and the second die 340 are disposed on a support surface 382. The electronic device 300 may comprise additional wire bonds (see FIG. 6) for other purposes, which is not illustrated in FIG. 3A.

The support surface 382 may be a top surface of a substrate 380, such as a printed circuit board (referred hereinafter as "PCB") or a molded lead frame structure that provides physical support for the first die 320 and the second die 340. The substrate 380 may comprise conductive traces such as metal traces within or on the top surface of the PCB or metal lead of lead frame. The support surface 382 may form a portion of a printed circuit board. Alternatively, the support surface 382 may comprise a plurality of lead frame arranged on one two-dimensional plane. The support surface 382 may optionally comprise a first die-attach-surface 384 configured to receive the first die 320, and a second die-attach-surface 386 configured to receive the second die 340. Each of the first die-attach-surface 384 and the second die-attach-surface 386 may form a portion of a lead frame or a portion of a PCB. The first die 320 and the second die 340 may remain electrically isolated. The support surface 382 may be encapsulated with a molding material that comprises an insulation material substantially. The first die-attach-surface 384 and the second die-attach-surface 386 are electrically isolated on the substrate 380 that is a single integrated body.

Figure 3B:
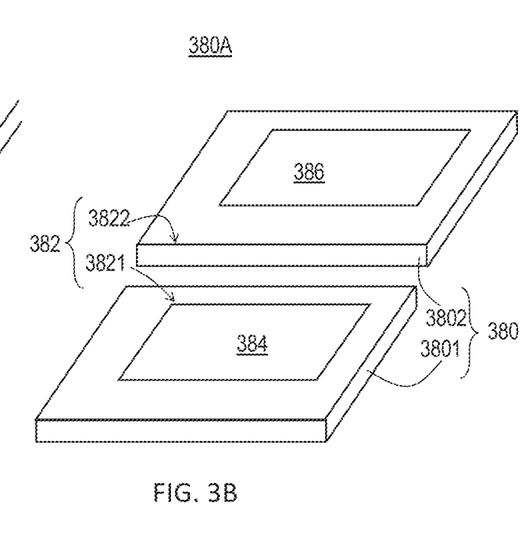
FIG. 3B shows a perspective view of an alternative substrate arrangement of the isolation device.

Alternatively, the substrate 380 may comprise two-body portions, as shown in FIG. 3B. FIG. 3B shows an alternative substrate 380A for the electronic device 300. For example, the substrate 380 may comprise a first body portion 3801 and a second body portion 3802. Similarly, the support surface 382 may comprise a first support portion 3821 and a second support portion 3822. In one embodiment, the first support portion 3821 may comprise a first top surface portion of a first PCB, whereas the second support portion 3822 may comprise a second top surface portion of a second PCB. The first top surface portion and the second top surface portion are substantially aligned on a two-dimensional plane. The first PCB and the second PCB may be a single integrated body during an initial stage of a manufacturing process but being sawn into two portions. Similarly, the first support portion 3821 may comprise a first die-attach-surface on a first lead frame, whereas the second support portion 3822 may comprise a second die-attach-surface on a second lead frame. The first lead frame and the second lead frame may form a single integrated structure during an initial stage of a manufacturing process before being singulated.

The first wire bond 324 is configured to receive the first current from the transmitter circuit 122 of the first die 320 so as to generate a magnetic field 114. The magnetic field 114 would induce an induced current in the second wire bond 344, which is to be detected by the current sense circuit 148 of the second die 340. As shown in FIG. 3A, the second wire bond 344 is arranged substantially in parallel with the first wire bond 324. This arrangement maximizes exposure of the second wire bond 344 to the magnetic field 114 from the first wire bond 324. The first wire bond 324 has a first end 324a and a second end 324b. The first end 324a of the first wire bond 324 is attached to the support surface 382, and the second end 324b of the first wire bond 324 is attached to a top surface of the first die 320. Similarly, the second wire bond 344 has a first end 344a and a second end 344b. The first end 344a of the second wire bond 344 is attached to the support surface 382, and the second end 344b of the second wire bond 344 is attached to a top surface of the second die 340. In one embodiment, both ends 324a and 324b of the first wire bond 324, and both ends 344a and 344b of the second wire bond 344 are attached to the support surface 382.

As the second wire bond 344 is configured to receive the magnetic field 114 from the first wire bond 324, the first wire bond 324 and the second wire bond 344 are arranged substantially in parallel. Two substantially parallel wire bonds exhibit one or more characteristics explained in subsequent paragraphs.

For example, the first end 324a of the first wire bond 324, and the first end 344a of the second wire bond 344 are positioned along a first axis 399. The second end 324b of the first wire bond 324, and the second end 344b of the second wire bond 344 are positioned along a second axis 398 that is parallel to the first axis 399. The first die 320 has a first die height, and the second die 340 has a second die height that is substantially similar to the first die height. As shown in FIG. 3A, the second axis 398 is located at a distance away from the support surface 382, which is substantially equal to the height t of the first die 320 or the height t of the second die 340.

Figure 3C:
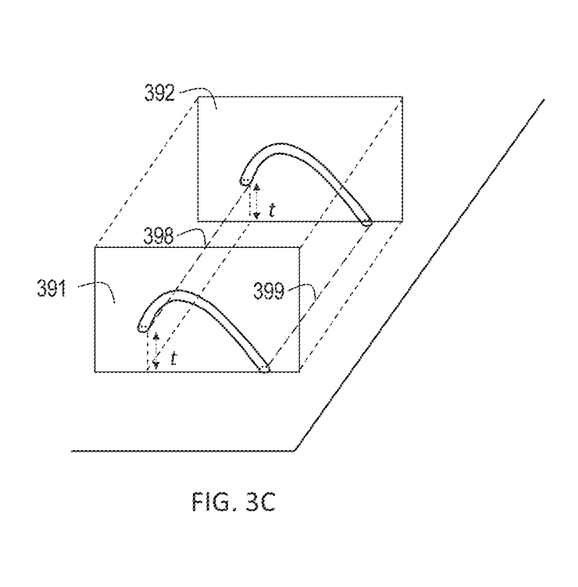
FIG. 3C shows a substantially parallel arrangement of two-wire bonds.

Optionally, the first wire bond 324 and the second wire bond 344 extends substantially in a two-dimensional plane, respectively. At least 90% of the wire bond is within the two-dimensional plane. Unless the bonding profile is tweaked to extend the wire bond in a three-dimensional manner, a wire bond usually extend in a two-dimensional plane. FIG. 3C shows a substantially parallel arrangement of the first wire bond 324 and the second wire bond 344. Each of the first wire bond 324 and the second wire bond 344 is positioned within a two-dimensional plane. Referring to FIG. 3C, the first wire bond 324 extends substantially along a first plane 391. The second wire bond 344 extends substantially along a second plane 392. The first plane 391 and the second plane 392 are arranged substantially orthogonal to the support surface 382 and being distanced away from each other.

Figures 3D, 3E:
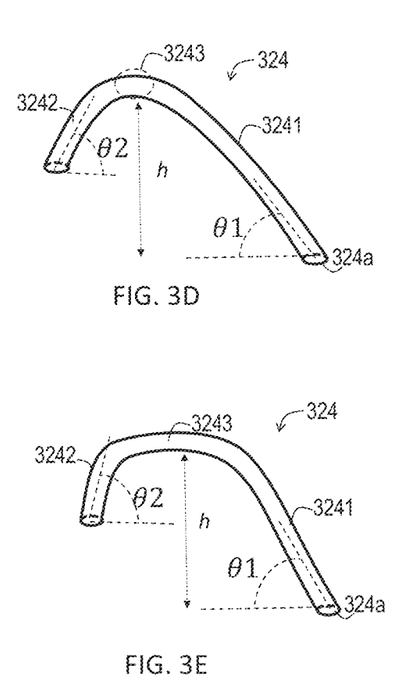
FIG. 3D shows a wire bond having a rounded triangular loop.
FIG. 3E shows a wire bond having a rounded trapezoidal loop.

In addition, the first wire bond 324 has a first wire bond curvature. The second wire bond 344 has a second wire bond curvature that is substantially similar to the first wire bond curvature. The first wire bond 324 and the second wire bond 344 are manufactured using the same wire bond loop profile. For example, the first wire bond 324 and the second wire bond may comprise a rounded triangular loop wire bond shown in FIG. 3D. Alternatively, the first wire bond 324 and the second wire bond 344 may comprise a substantially rounded trapezoidal loop wire bond shown in FIG. 3E. As shown in FIG. 3D, and FIG. 3E, the rounded triangular loop wire bond, and the rounded trapezoidal loop wire bond do not have pointed angles. The bending of the wire bond defines the rounded angle instead.

Referring to FIG. 3D, the first wire bond 324 comprises a first portion 3241 and a second portion 3242 separated from the first portion 3241 by a maximum height point 3243. The maximum height point 3243 has a distance h from the support surface 382 that is the furthest distance from the support surface 382. The first portion 3241 extends from the first end 324a to the maximum height point 3243. The second portion 3242 extends from the maximum height point 3243 towards the second end 324b. The first portion 3241 of the first wire bond 324 forms an angle θ1 that is approximately between 30 degrees and 50 degrees with the support surface 382. The second portion 3242 of the first wire bond 324 forms an angle θ2 that is approximately between 70 degrees and 90 degrees with the support surface 382. The parameters of the first angle θ1, the second angle θ2, the length of the first portion 3241, and the length of the second portion 3242 may have design considerations relating to the efficiency of the signal transmission.

In one embodiment, the length of the first portion 3241 is to be chosen to be substantially longer than the second portion 3242. The first angle θ1 is to be designed to be as close as possible to 45 degrees. In the embodiment shown in FIG. 3D, the first portion 3241 of the first wire bond 324 has a first length, the second portion 3242 of the first wire bond 324 has a second length that is less than 50% of the first length. In this way, the first length is at least two-thirds of the total length of the first wire bond 324. In another embodiment, the first angle θ1 may be approximately 45 degrees. The second angle θ2 may be selected to be closer to 90 degrees. In this way, the second portion 3242 may be made shorter and with higher precision through the wire bond equipment. In yet another embodiment where both the first end 324a and the second end 324b are attached on the support surface 382, the first angle θ1 and the second angle θ2 are selected closer to 45 degrees, for example, within 30 degrees and 60 degrees. In addition, the first portion 3241 and the second portion 3242 may have substantially similar lengths.

The embodiment in FIG. 3E has a first wire bond 324 that comprises a rounded trapezoidal loop wire bond. As shown in FIG. 3E, the first wire bond 324 comprises a first portion 3241 extending from the first end 324a, a second portion 3242 connected to the second end 324b, and a middle portion 3243. The middle portion 3243 is positioned between the first portion 3241 and the second portion 3242. The middle portion 3243 is arranged substantially in parallel with the support surface 382. Similar to the embodiment shown in FIG. 3D, the first portion 3241 of the first wire bond 324 forms a first angle θ1 with the support surface 382 that is approximately between 30 degrees and 50 degrees. The second portion forms a second angle θ2 with a top surface of the second die 340 that is approximately between 70 degrees and 90 degrees. The second portion 3242 of the first wire bond 324 is substantially shorter as compared to other portion of the first wire bond. For example, consider one embodiment where the first portion 3241 of the first wire bond 324 has a first length; the middle portion 3243 of the first wire bond 324 has a middle length, and the second portion 3242 of the first wire bond 324 has a second length. The second length that is less than 50% of a combined length of the first length and the middle length. As the second wire bond 344 is substantially in parallel, having substantially the same length and the same curvature, the discussion about the first wire bond in FIG. 3D, and FIG. 3E are equally applicable to the second wire bond 344.

Figure 4A:
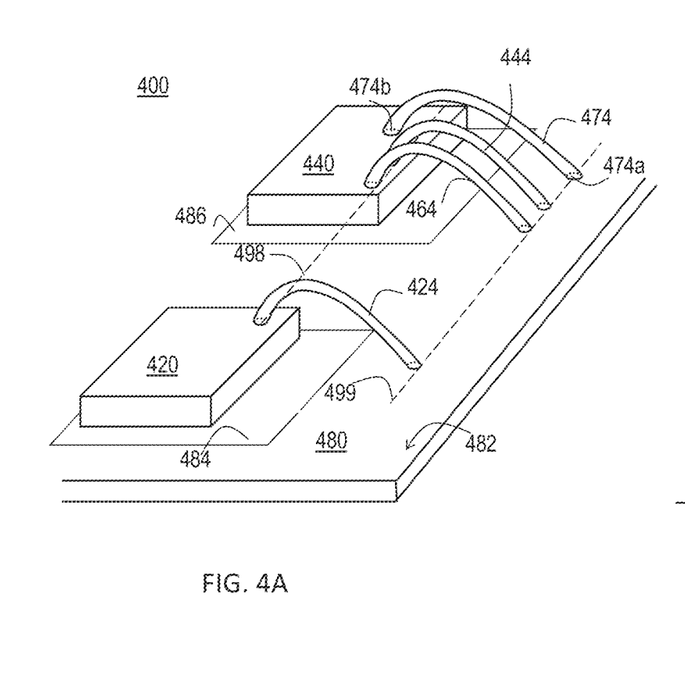
FIG. 4A shows a perspective view of an isolation device with optional shield wires.

FIG. 4A shows an electronic device 400. The electronic device 400 comprises a first die 420, a second die 440, a first wire bond 424, and a second wire bond 444. Optionally, the electronic device 400 may comprise a third wire bond 464 and the fourth wire bond 474 as shield wires. The wire bonds 424, 444, 464, and 474 are implementation examples of the elongated conducting elements 124, 144, 164 and 174, respectively. The first die 420 comprises a transmitter circuit 122, which may have a current generator 128 and a modulation circuit 129. The second die 440 may comprise a current sense circuit 148 and a demodulation circuit 149. The first die 420 and the second die 440 are disposed on a support surface 482. For example, the first die 420 and the second die 440 may be disposed on a die attach pads 484 and 486 respectively. In another embodiment, the first die 420 and the second die 440 may be disposed on die receiving surfaces 484 and 486 of a lead frame. The electronic device 400 is substantially similar to the electronic device 300 but differs at least in that the electronic device 400 comprises additional shield wires in the third wire bond 464 and the fourth wire bond 474. For this reason, all the discussion of the first wire bond 324 and the second wire bond 344 of the electronic device 300 are applicable. The electronic device 400 may comprise additional wire bonds (not shown) for other purposes, which is not illustrated in FIG. 4A and other subsequent drawings in FIG. 4B, and FIG. 4G.

Figure 4B:
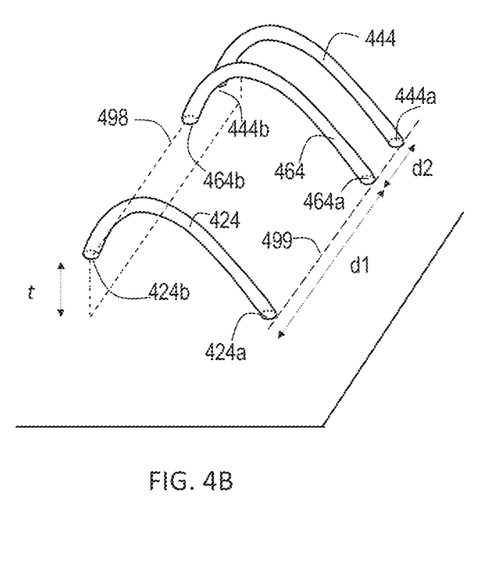
FIG. 4B shows an example of how a first shield wire is positioned relative to the two-wire bonds.

FIG. 4B shows an example of how the third wire bond 464 is positioned relative to the first wire bond 424 and the second wire bond 444. The third wire bond 464 is arranged between the first wire bond 424 and the second wire bond 444. Referring to FIG. 4A, and FIG. 4B, the third wire bond 464 is in parallel arrangement with the second wire bond 444, which in turn is in parallel arrangement with the first wire bond 424. Each of the first wire bond 424, the second wire bond 444, and the third wire bond 464 has a substantially similar wire bond length. As shown in FIG. 4A, and FIG. 4B, the first wire bond 424 has a first wire bond curvature; the second wire bond has a second wire bond curvature, and the third wire bond 464 has a third wire bond curvature. The first wire bond curvature, the second wire bond curvature, and the third wire bond curvature are substantially similar.

Referring to FIG. 4A, and FIG. 4B, the third wire bond 464 may be positioned closer to the second wire bond 444. As shown in FIG. 4B, the third wire bond 464 is positioned at a first distance away d1 from the first wire bond 424, and at a second distance d2 away from the second wire bond. The second distance d2 is shorter than the first distance d1. In one embodiment, the second distance d2 may be substantially shorter than the first distance d1 such that the second distance d2 is less than approximately 20% of the first distance. In the embodiment shown in FIG. 4A, and FIG. 4B, the third wire bond 464 is selected to shield the second wire bond 444 and therefore is positioned closer to the second wire bond 444. In other embodiments, the third wire 464 may be positioned in the center or closer to the second wire bond 444. The curvature, arrangement, and profile of the first wire bond 424 and the third wire bond 464 are selected relative to the second wire bond 444. In another embodiment, the third wire bond 464 may be primarily selected to prevent emission of the electric field and therefore placed closer to the first wire bond 424. The curvature, arrangement, and profile of the second wire bond 444 and the third wire bond 464 are selected relative to the first wire bond 424 instead.

The first wire bond 424 comprises a first end 424a and a second end 424b. The second wire bond 444 comprises a first end 444a and a second end 444b. The third wire bond 464 comprises a first end 464a and a second end 464b. As shown in FIG. 4B, the first end 424a of the first wire bond 424, the first end 444a of the second wire bond 444 and the first end 464a of the third wire bond 464 are disposed on a straight line or the first axis 499. The second end 424b of the first wire bond 424, the second end 444b of the second wire bond 444, and the second end 464b of the third wire bond 464 are disposed on a straight line or the second axis 498 that is in parallel but distanced away from the first axis 499.

One of the first end 464a and the second end 464b of the third wire bond 464 is electrically connected to a grounded conducting structure. The other one of the first end 464a and the second end 464b of the third wire bond 464 is electrically connected to an insulating material. For example, the second end 464b of the third wire bond 464 is attached to an electrically isolated bond pad of the second die 440. However, the electrically isolated bond pad is surrounded by an electrical insulation material in the second die 440. By having one end of the third wire bond 464 is open-ended and another end being grounded, the third wire bond 464 is configured to prevent a substantial amount of electric current from flowing through the third wire bond 464. In this way, the third wire bond 464 may function as an electrical shield to shield of electric field 116 from the first wire bond 424, as explained in FIG. 2A, and FIG. 2B. In general, the third wire bond 464 does not allow an electric current to flow through. However, a small amount of current may flow from ground to the third wire bond 464 when an electric field 116 is induced.

As shown in FIG. 4A, the fourth wire bond 474 has a curvature that is substantially similar to the second wire bond 444. Each of the first wire bond 424, the second wire bond 444, and the third wire bond 464 has a common wire bond height whereas the fourth wire bond 474 has a height that is higher than the common wire bond height. The fourth wire bond 474 and the third wire bond 464 are configured to shield the second wire bond 444.

Figure 4C:
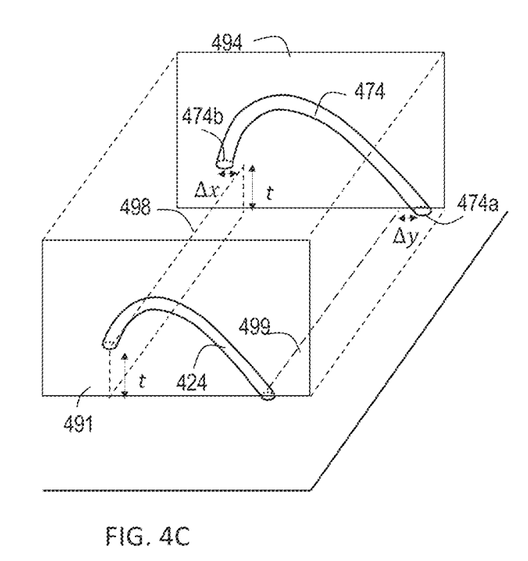
FIG. 4C shows a substantially parallel arrangement of the two-wire bonds.
Figure 4D:
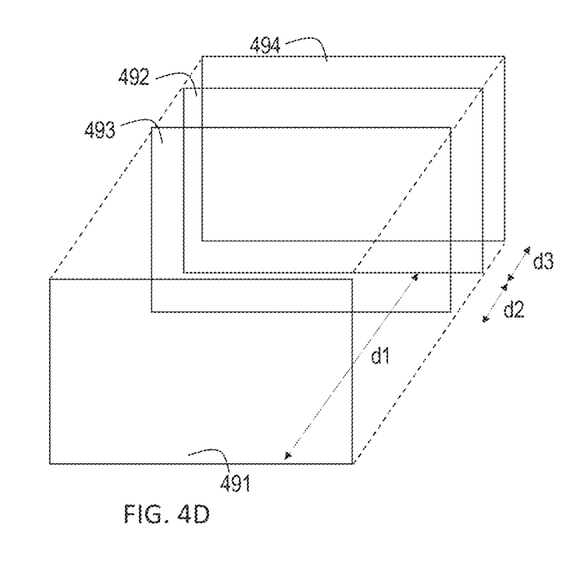
FIG. 4D shows a plurality of two-dimensional planes where the wire bonds reside.
Figure 4E:
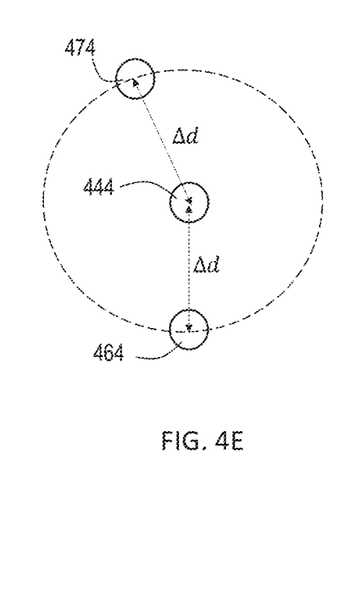
FIG. 4E shows a cross-sectional view of the wire bonds taken at a horizontal plane.

Similar to the third wire bond 464, one of the first end 474a and the second end 474b of the fourth wire bond 474 is electrically connected to a grounded conducting structure. The other one of the first end 474a and the second end 474b of the fourth wire bond 474 is electrically connected to an insulating material such that the fourth wire bond 474 defines an electrically opened ended structure. The second wire bond 444 is positioned between the third wire bond 464 and the fourth wire bond 474. FIG. 4C shows a parallel arrangement of the first wire bond 424 and the fourth wire bond 474 in a two-dimensional plane. FIG. 4D shows a parallel arrangement of a plurality of two-dimensional planes 491-494 where each of the first wire bond 424, the second wire bond 444, the third wire bond 464, and the fourth wire bond 474 resides. FIG. 4E shows a cross-sectional view of the second wire bond 444, the third wire bond 464 and the fourth wire bond 474 taken at a plane that is parallel to the support surface 482.

In the embodiment shown in FIG. 4A, each of the first wire bond 424, the second wire bond 444, the third wire bond 464 and the fourth wire bond 474 is substantially arranged within a two-dimensional plane. Referring to FIG. 4A, FIG. 4C, and FIG. 4D, the first wire bond 424 extends substantially in a first two-dimensional plane 491. The second wire bond 444 extends substantially in a second two-dimensional plane 492. The third wire bond 464 extends substantially in a third two-dimensional plane 493. The fourth wire bond 474 extends substantially in a fourth two-dimensional plane 494. Each of the two-dimensional planes 491-494 is arranged orthogonal to the support surface 482 and parallel to each other.

The first two-dimensional plane 491 is positioned substantially further away at a distance from the second two-dimensional plane 492, the third two-dimensional plane 493 and the fourth two-dimensional plane 494. Therefore, the distance d1 between the first wire bond 424 and the second wire bond 444 is substantially longer than the distance d2 between the second wire bond 444 and the third wire bond 464. Similarly, the distance d1 is substantially longer than the distance d3 between the second wire bond 444 and the fourth wire bond 474.

As shown in FIG. 4A, the first wire bond 424, the second wire bond 444 and the third wire bond 464 have a substantially similar length. However, the fourth wire bond 474 is longer than any one of the first wire bond 424, the second wire bond 444 and the third wire bond 464. The fourth wire bond 474 is looped taller than one of the first wire bond 424, the second wire bond 444 and the third wire bond 464. However, at any cross-sectional view on a plane parallel to the support surface 482, the third wire bond 464 and the fourth wire bond 474 are at a similar distance away from the second wire bond 444, as shown in FIG. 4E. In other words, the third wire bond 464 and the fourth wire bond 474 are positioned at an equidistance ($\Delta d$) from the second wire bond 444. Referring to FIG. 4A, FIG. 4D and FIG. 4E, considering that the fourth wire bond 474 is longer and looped taller as compared to the second wire bond 444, the distance d3 is slightly shorter than the distance d2.

Figure 4F:
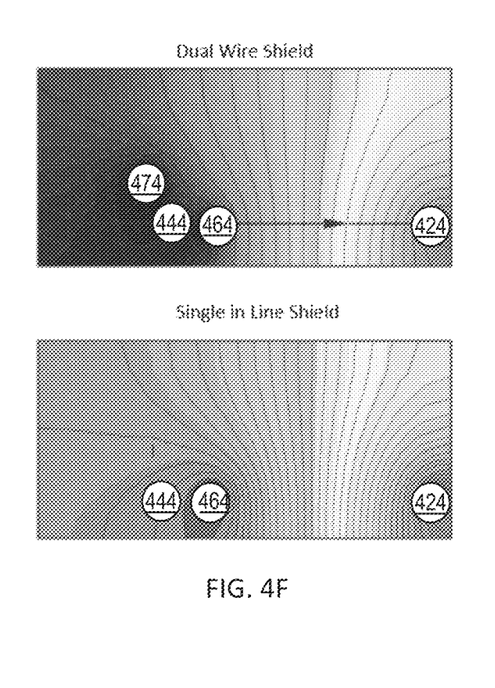
FIG. 4F shows a simulation result comparing of impacts of the electric field on an isolation device with single wire shield and another isolation device with dual wire shields.

The equidistance arrangement of the third wire bond 464 and the fourth wire bond 474 has a technical advantage. Recall that a small current may flow within the third wire bond 464 and the fourth wire bond 474, respectively, when an electric field is asserted. By using the equidistance arrangement, the effect of the small current can be reduced. Specifically, the third wire bond 464 and the fourth wire bond 474 are configured such that magnetic fields caused by a current flow in each of the third wire bond 464 and the fourth wire bond 474 cancel out each other in the second wire bond 444. FIG. 4F shows a comparison of the impact of the electric field 116 from the first wire bond 424 to an isolation device with only the third wire bond 464 (single wire shield) and an isolation device with both the third wire bond 464 and the fourth wire bond 474 (dual wire shield). The simulation results show that the combination of the third wire bond 464 and fourth wire bond 474 works better.

Figure 4G:
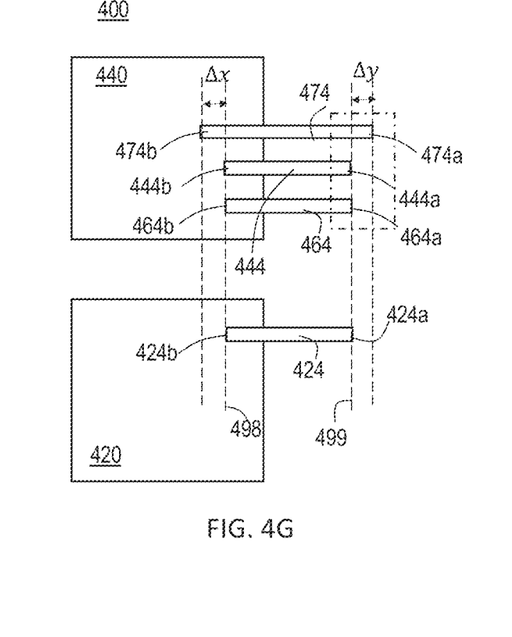
FIG. 4G shows a top view of the isolation device shown in FIG. 4A.
Figure 4H:
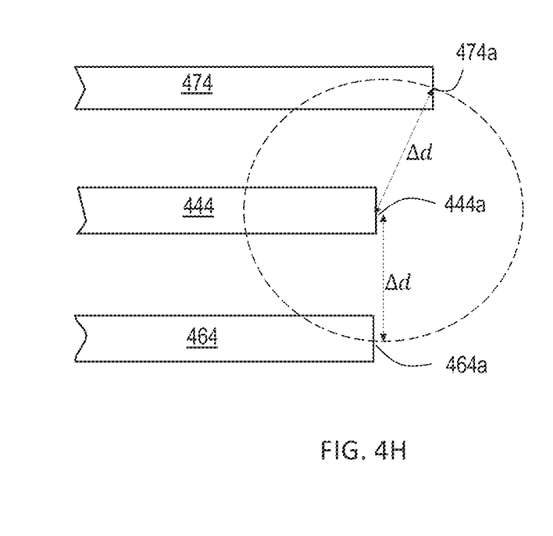
FIG. 4H shows a blown-out view of a rectangular portion.

FIG. 4G is a conceptual top view of the electronic device 400 shown without the substrate 480. Referring to FIG. 4A, FIG. 4E and FIG. 4G, the fourth wire bond 474 has a first end 474a and a second end 474b. The first end 424a of the first wire bond 424 and the first end 444a of the second wire bond 444 are disposed on the first axis 499 that is parallel to a side of the first die 420. In contrast, the first end 474a of the fourth wire bond 474 is positioned offset away ($\Delta x$) from the first axis 499. Similarly, the second end 424b of the first wire bond 424 and the second end 444b of the second wire bond 444 are disposed on a second axis 498 or the second axis 498 that is parallel to a side of the first die 420. The second end 474b of the fourth wire bond 474 is positioned offset away ($\Delta y$) from the second axis 498. FIG. 4H shows a blown-out view of a rectangular portion of the top view shown in FIG. 4G. Referring to FIG. 4A, FIG. 4G and FIG. 4H, the first end 444a of the second wire bond 444 is arranged at a first distance ($\Delta d$) away from the first end 464a of the third wire bond 464. The first end 444a of the second wire bond 444 is arranged at a second distance ($\Delta d$) away from the first end 474a of the fourth wire bond 474. The first distance is substantially similar to the second distance.

Figure 5A:
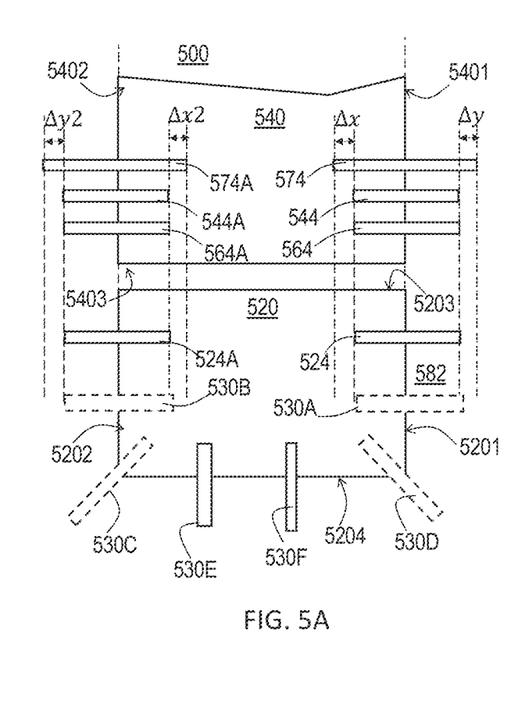
FIG. 5A shows a dual-channel device.

FIG. 5A shows a top view of a dual-channel device 500. As shown in FIG. 5A, the dual-channel device 500 comprises a transmitter die 520, a receiver die 540, a first wire bond 524 and a second wire bond 544. Optionally, the dual-channel device 500 may comprise a third wire bond 564 and the fourth wire bond 574 as shield wires. The wire bonds 524, 544, 564 and 574 are implementation examples of the elongated conducting elements 124, 144, 164 and 174, respectively. The transmitter die 520 comprises a transmitter circuit 122, which may have a current generator 128 and a modulation circuit 129. The receiver die 540 may comprise a current sense circuit 148 and a demodulation circuit 149. The transmitter die 520 and the receiver die 540 are disposed on a support surface 582, which is a portion of a substrate that provides physical support. The substrate may be a PCB or a molded lead frame body. Each of the first wire bond 524, the second wire bond 544, the third wire bond 564 and the fourth wire bond 574 has a first end attached on the support surface 582, and a second end attached on transmitter die 520 or the receiver die 540 as explained in previous embodiments.

The dual-channel device 500 is substantially similar to the electronic device 400 shown in FIG. 4A and FIG. 4G but differs at least in that the dual-channel communication device 500 comprises an additional first wire bond 524A, an additional second wire bond 544A, an additional third wire bond 564A, and an additional fourth wire bond 574A. The additional wire bonds 524A, 544A, 564A and 574A are substantially similar to the wire bonds 524, 544, 564 and 574 in terms of functionality and physical appearance. The additional wire bonds 524A, 544A, 564A and 574A are positioned on a different side of the transmitter die 520. For example, in the embodiment shown in FIG. 5A, the additional wire bonds 524A, 544A, 564A and 574A are positioned on an opposite side of the transmitter die 520, as compared to the wire bonds 524, 544, 564 and 574. Each of the additional first wire bond 524A, the additional second wire bond 544A, the additional third wire bond 564A and the additional fourth wire bond 574A has a first end attached on the support surface 582 and a second end attached on transmitter die 520 or the receiver die 540.

The additional first wire bond 524A is configured to generate an additional magnetic field that corresponds with an additional signal. The additional first wire bond 524A is configured to receive an additional first current from the transmitter die 520 so as to generate an additional magnetic field. The additional magnetic field induces an additional induced current in the additional second wire bond 544A, which is to be detected by the receiver die 540. The additional second wire bond 544A is arranged substantially in parallel with the additional first wire bond 524A. The additional third wire bond 564A is arranged substantially in parallel with the additional second wire bond 544A between the additional first wire bond 524A, and the additional second wire bond 544A has a similar length and a similar curvature substantially. The additional second wire bond 544A and the additional third wire bond 564 have a similar length and a similar curvature substantially. The additional fourth wire bond 574A is slightly longer than the additional second wire bond 544A and the additional third wire bond 564A, but having the same curvature. The additional fourth wire bond 574A is arranged in parallel with the additional second wire bond 544A such that the additional second wire bond 544A is disposed between the additional third wire bond 564a and the additional fourth wire bond 574A.

As shown in the top view of the dual-channel device 500, the transmitter die 520 comprises four sides, i.e., a first transmitter coupling side 5201, a second transmitter coupling side 5202, a transmitter facing side 5203, and a transmitter signaling side 5204. The terms 'coupling side', 'signaling side' and 'facing side' are chosen to merely facilitate understanding. The terms should not be interpreted to impose limitations. The first transmitter coupling side 5201 and the second transmitter coupling side 5202 are on opposite sides of the transmitter die 520. In contrast, the transmitter facing side 5203 and the transmitter signaling side 5204 are on an opposite sides of the transmitter die 520. The first transmitter coupling side 5201 and the second transmitter coupling side 5202 are arranged orthogonal to the transmitter facing side 5203. Similarly, the receiver die 540 comprises four sides, i.e., a first receiver coupling side 5401, a second receiver coupling side 5402, a receiver facing side 5403, and a receiver signaling side (not shown). The first receiver coupling side 5401 and the second receiver coupling side 5402 are on opposite sides of the receiver die 540. The receiver facing side 5403 and the receiver signaling side (not shown) are on opposite sides of the receiver die 540. The first receiver coupling side 5401 and the second receiver coupling side 5402 are arranged orthogonal to the receiver facing side 5403. The first receiver coupling side 5401 is substantially in alignment with the first transmitter coupling side 5201. The second receiver coupling side 5402 is substantially in alignment with the second transmitter coupling side 5202. In other words, the transmitter die 520, and the receiver die 540 are arranged such that the first transmitter coupling side 5201 and the first receiver coupling side 5401 forms a straight line.

As shown in FIG. 5A, the first wire bond 524, which is for signal coupling purposes, is positioned at the first transmitter coupling side 5201. The second wire bond 544 for a similar purpose is positioned on the first receiver coupling side 5401. The first end of the first wire bond 524 is positioned adjacent to the first transmitter coupling side 5201 of the transmitter die 520. The first end of the second wire bond 544 is positioned adjacent to the first receiver coupling side 5401. The first end of the third wire bond 564, and the first end of the fourth wire bond 574 are positioned adjacent to the first receiver coupling side 5401.

The receiver facing side 5403 is arranged facing the transmitter facing side 5203. Each of the transmitter facing side 5203 and the receiver facing side 5403 is devoid of a wire bond. In this way, the transmitter die 520 can be placed closer to the receiver die 540 so as to receive, at the second wire bond 544, a stronger magnetic field 114 from the first wire bond 524.

Similarly, the first end of the additional first wire bond 524A is positioned adjacent to the second transmitter coupling side 5202 of the transmitter die 520. The first end of the additional second wire bond 544A is positioned adjacent to the second receiver coupling side 5402. The first end of the additional third wire bond 564A and the first end of the additional fourth wire bond 574A are positioned adjacent to the second receiver coupling side 5402. The transmitter die 520 may transmit a signal through a first channel in the first wire bond 524, and/or the second channel in the additional first wire bond 524A.

The transmitter die 520 may comprise additional wire bonds 530A-530F. However, the position of the additional wire bonds 530A-530F may have an effect on the magnetic field generated by the first wire bond 524 or the additional first wire bond 524A. For example, a wire bond such as the wire bonds 530A and 530B, which are in a parallel to the first wire bond 524 and the additional first wire bond 524A may create a magnetic field in a similar direction as the first wire bond 524 and the additional first wire bond 524A. However, the wire bonds 530A and 530B, if grounded on one end and being open circuit on another end, may be suitable to function as a shield wire for the first wire bond 524 and the additional first wire bond 524A. On the other hand, a wire bond such as wire bonds 530C and 530D may create a magnetic field that is non-orthogonal to the first wire bond 524 and the additional first wire bond 524A. In contrast, a wire bond such as wire bonds 530E and 530F arranged orthogonal to the first wire bond 524 and the additional first wire bond 524A will have a minimal effect on the magnetic field generated from the first wire bond 524 and the additional first wire bond 524A. The wire bonds 530A-530D are optional and therefore shown in dotted lines.

In another embodiment, the transmitter die 520 comprises a plurality of additional wire bonds 530E and 530F as inputs or outputs that extend in an orthogonal direction relative to the first wire bond 524 and the additional first wire bond 524A. Similarly, the receiver die 540 comprises a plurality of additional wire bonds (not shown) as inputs or outputs that extend in an orthogonal direction relative to the second wire bond 544 and the additional second wire bond 544A. The wire bonds 530E and 530F extend in a plane that is orthogonal to the transmitter signaling side 5204 of the transmitter die 520. Optionally, the transmitter die 520 comprises a shield wire bond 530A disposed between the first wire bond 524 and the plurality of additional wire bonds 530E and 530F. The shield wire bond 530A is grounded on one end. The transmitter die 520 is devoid of additional non-shield wire bonds that extend in a different direction as compared to the wire bonds 530A and 530B. Non-shield wire bonds are wire bonds that are connected to establish a signal or to supply power and not to function as a shield. An electric current that is more than 0.1 mA may flow in the non-shield wire bonds.

Figure 5B:
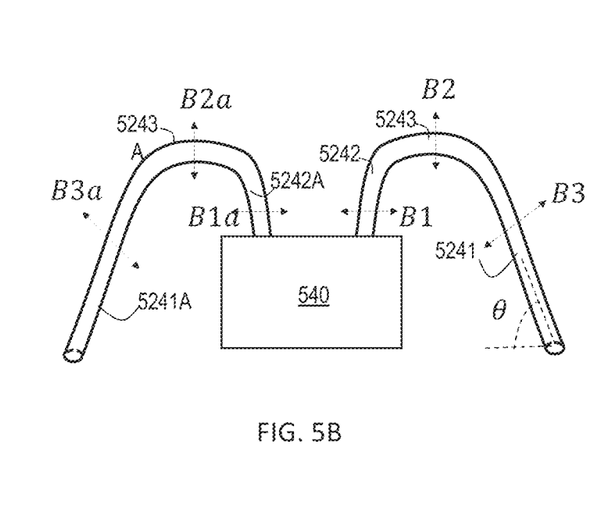
FIG. 5B shows a cross-sectional view of the dual-channel device shown in FIG. 5A.

FIG. 5B shows a cross-sectional view of the dual-channel device 500 shown in FIG. 5A. Referring to FIG. 5B, the first wire bond 524 and the additional first wire bond 524A have substantially vertical portions 5242 and 5242A near the second end positioned on the transmitter die 520, substantially horizontal portions 5243 and 5243A and substantially slopping portions 5241 and 5241A, respectively. The substantially vertical portions 5242 and 5242A are substantially in parallel, and thus, generate magnetic field B1 and B1a that may interfere with each other. Magnetic fields B2 and B2a generated from the substantially horizontal portions 5243 and 5243A are in parallel and distanced away. For this reason, the magnetic fields B2 and B2a will not interfere with each other. Each of the slopping portions 5241 and 5241A will be substantially orthogonal with each other when the angle θ is close to 45 degrees, and thus, generating magnetic fields B3 and B3a that do not interfere with each other. For this reason, the angle θ formed between the sloping portion 5241 and the support surface 582 is optimally at 45 degrees or within the range of 30 degrees and 50 degrees. The substantially vertical portions 5242 and 5242A may cause noise, but this is not the case for other portions such as 5241, 5243, 5241A, and 5243A. One way to reduce the noise is to have a shorter vertical portions 5242 and 5242A. For example, the vertical portion 5242 should be less than 30% of the entire length of the first wire bond 524, as explained in FIG. 3D and FIG. 3E.

Figure 6:
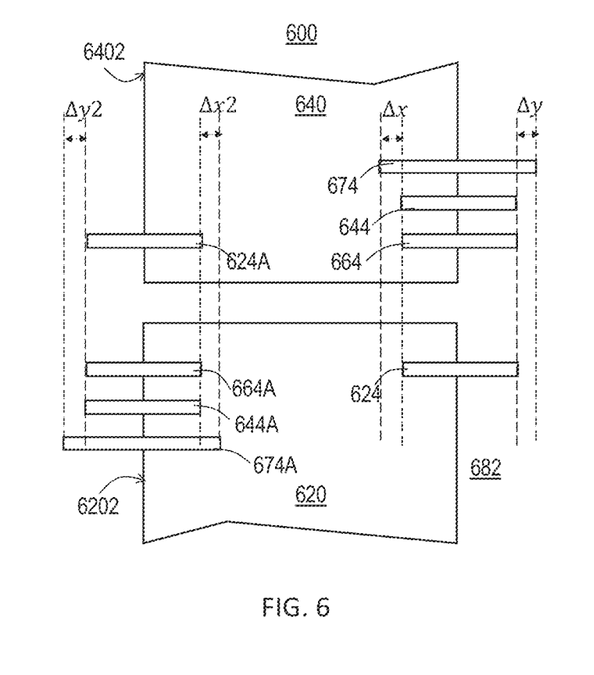
FIG. 6 shows a bi-directional device.

FIG. 6 shows a top view of a bi-directional device 600. The bi-directional device 600 comprises a transmitter die 620, a receiver die 640, a first wire bond 624 and a second wire bond 644. Optionally, the bi-directional device 600 may comprise a third wire bond 664 and the fourth wire bond 674 as shield wires. The wire bonds 624, 644, 664 and 674 are implementation examples of the elongated conducting elements 124, 144, 164 and 174, respectively. The transmitter die 620 comprises a transmitter circuit 122, which may have a current generator 128 and a modulation circuit 129. The receiver die 640 may comprise a current sense circuit 148 and a demodulation circuit 149. The transmitter die 620, and the receiver die 640 are disposed on a support surface 682, which is a portion of a substrate that provides physical support that can be a PCB or a molded lead frame body. Each of the first wire bond 624, the second wire bond 644, the third wire bond 664 and the fourth wire bond 674 has a first end attached on the support surface 682, and a second end attached on transmitter die 620 or the receiver die 640 as explained in previous embodiments.

The bi-directional device 600 comprises an additional first wire bond 624A, an additional second wire bond 644A, an additional third wire bond 664A, and an additional fourth wire bond 674A. The bi-directional device 600 is substantially similar to the dual-channel device 500 but differs at least in that the additional first wire bond 624A is disposed on the receiver die 640. Besides, the additional second wire bond 644A, the additional third wire bond 664A, the additional fourth wire bond 674A are positioned at the transmitter die 620. In this way, each of the transmitter die 620 and the receiver die 640 can be configured to send signals. As shown in FIG. 6, the first end of the additional first wire bond 624A is positioned adjacent to the second receiver coupling side 6402 of the receiver die 640. The first end of the additional second wire bond 644A is positioned adjacent to the second transmitter coupling side 6202. The first end of the additional third wire bond 664A and the first end of the additional fourth wire bond 674A are positioned adjacent to the second transmitter coupling side 6202. By having the additional second wire bond 644A on the transmitter die 620, the transmitter die 620 can be configured to receive a signal from the receiver die 640.

Figure 7:
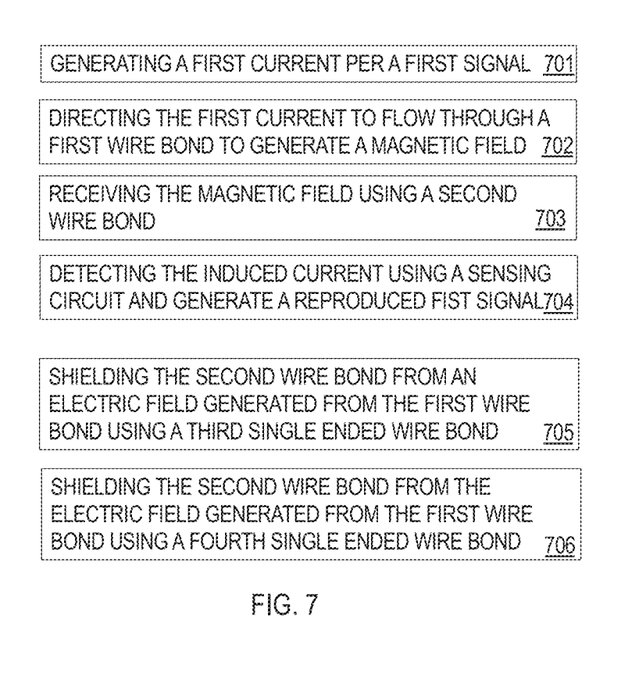
FIG. 7 shows a method for transmitting a signal across isolation material.

FIG. 7 shows a method 700 for transmitting a signal across isolation material using wire bonds. In step 701, a first current that corresponds with a first signal is generated using a transmitter die. In step 702, the first current is directed to flow through a first wire bond so as to generate a magnetic field. In step 703, the magnetic field is received using a second wire bond that is connected to a receiver die. An induced current is generated in the second wire bond when the magnetic field is incident on the second wire. In step 704, the induced current is detected using a sensing circuit, and the first signal is reproduced as an output. In step 705, the second wire bond is shielded from an electric field generated from the first wire bond using a third wire bond. In step 706, the second wire bond is shielded from the electric field generated from the first wire bond using a fourth wire bond.

Steps 701-706 may not be performed sequentially, and some of the steps may be performed in parallel as understood by a person skilled in the art. As shown in previous embodiments, each of the first wire bond, the second wire bond and the third wire bond has a similar curvature. In addition, the first wire bond, the second wire bond and the third wire bond are arranged substantially in parallel. The third wire bond has one end electrically connected to ground, and another end being electrically open-ended. Similarly, the fourth wire bond has one end electrically connected to ground and another end being electrically open-ended.

Different aspects, embodiments or implementations may, either individually and/or in combination, but need not, yield one or more of the following advantages. For example, the arrangement of the first wire bond 424, the second wire bond 444, the third wire bond 464 and the fourth wire bond 474 shown in various embodiments may be configured to minimize a coupling noise.

Various embodiments of the invention are contemplated in addition to those disclosed hereinabove. The above-described embodiments should be considered as examples of the present invention rather than as limiting the scope of the invention. In addition to the foregoing embodiments of the invention, a review of the detailed description and accompanying drawings will show that there are other embodiments of the invention. Accordingly, many combinations, permutations, variations and modifications of the foregoing embodiments of the invention not set forth explicitly herein will nevertheless fall within the scope of the invention.

We claim:

1. A device for transmitting a first signal from a first circuit to a second circuit, comprising:
    a transmitter circuit configured to generate a first current in accordance with a first signal;
    a first elongated conducting element configured to generate a magnetic field when the first current flows through the first elongated conducting element;
    a second elongated conducting element adjacent to the first elongated conducting element so as to receive the magnetic field, wherein the second elongated conducting element is configured to generate an induced current when the magnetic field is received;
    a receiver circuit configured to receive the induced current as an input, and configured to generate a reproduced first signal as an output of the receiver circuit; and
    a third elongated conducting element extending substantially in parallel with the first elongated conducting element and the second elongated conducting element, wherein the third elongated conducting element is grounded on one end so as to shield the second elongated conducting element from an electric field generated from the first elongated conducting element.

2. The device of claim 1, further comprising a fourth elongated conducting element that is grounded on one end, wherein the fourth elongated conducting element is configured such that a magnetic field generated from the fourth elongated conducting element as detected at the second elongated conducting element cancels out a magnetic field generated from the third elongated conducting element when a similar electric current flow through the third elongated conducting element and the fourth elongated conducting element respectively.

3. The device of claim 1, wherein the first elongated conducting element comprises at least one of a wire-bond, a conducting trace of a printed circuit board and a lead frame.

4. The device of claim 1, wherein:
    the first elongated conducting element comprises a first wire bond having a first end and a second end;
    the second elongated conducting element comprises a second wire bond having a first end and a second end, wherein the second wire bond is arranged substantially in parallel with the first wire bond;
    the transmitter circuit comprises a transmitter die disposed on a support surface; and
    the receiver circuit comprises a receiver die disposed on the support surface.

5. The device of claim 4, wherein:
    the first end of the first wire bond is attached to the support surface and the second end of the first wire bond is attached to a top surface of the transmitter die; and
    the first end of the second wire bond is attached to the support surface, and the second end of the second wire bond is attached to a top surface of the receiver die.

6. The device of claim 4, wherein:
    the first end of the first wire bond and the first end of the second wire bond are positioned along a first axis; and
    the second end of the first wire bond and the second end of the second wire bond are positioned along a second axis that is parallel to the first axis.

7. The device of claim 4, wherein:
    the first wire bond extends substantially along a first plane; and
    the second wire bond extends substantially along a second plane, wherein the first plane and the second plane are arranged substantially orthogonal to the support surface.

8. The device of claim 4, wherein the first wire bond comprises:
    a first portion extending from the first end of the first wire bond, wherein the first portion of the first wire bond forms a first angle with the support surface;
    a middle portion connected to the first portion and arranged substantially in parallel with the support surface; and
    a second portion connected to the middle portion and the second end, wherein the second portion forms a second angle with a top surface of the transmitter die, wherein the first angle is approximately between 30 degrees and 50 degrees.

9. The device of claim 8, wherein:
    the first portion of the first wire bond has a first length;
    the middle portion of the first wire bond has a middle length; and
    the second portion of the first wire bond has a second length, wherein the second length that is less than 50% of a combined length of the first length and the middle length.

10. The device of claim 4, further comprising a third wire bond having a first end and a second end, wherein the third wire bond is arranged between the first wire bond and the second wire bond.

11. The device of claim 10, wherein the third wire bond is positioned at a first distance away from the first wire bond, and at a second distance away from the second wire bond, and wherein the second distance is shorter than the first distance.

12. The device of claim 10, wherein:
    the first wire bond has a first wire bond curvature;
    the second wire bond has a second wire bond curvature; and
    the third wire bond has a third wire bond curvature, wherein the first wire bond curvature, the second wire bond curvature, and the third wire bond curvature are substantially similar.

13. The device of claim 10, wherein one of the first end and the second end of the third wire bond is electrically connected to a grounded conducting structure, and wherein the other one of the first end and the second end of the third wire bond is electrically connected to an insulating material such that the third wire bond defines an electrically opened ended structure.

14. The device of claim 10, further comprising a fourth wire bond having a first end and a second end, wherein the second wire bond is disposed between the third wire bond and the fourth wire bond.

15. The device of claim 14, wherein the first end of the first wire bond and the first end of the second wire bond is disposed in a first line that is parallel to a side of the transmitter die, and wherein the first end of the fourth wire bond is positioned offset away from the first line.

16. The device of claim 14, wherein:
the first end of the second wire bond is arranged at a first distance away from the first end of the third wire bond;
the first end of the second wire bond is arranged at a second distance away from the first end of the fourth wire bond; and
the first distance is substantially similar to the second distance.

17. The device of claim 14, wherein the first wire bond, the second wire bond and the third wire bond has a substantially similar length, and wherein the fourth wire bond is longer than each of the first wire bond, the second wire bond and the third wire bond.

18. A method of transmitting a signal from a first circuit to a second circuit, comprising:
generating a first current that corresponds with a first signal using a transmitter die;
directing the first current to flow through a first wire bond so as to generate a magnetic field;
receiving the magnetic field using a second wire bond that is connected to a receiver die, wherein an induced current is generated in the second wire bond when the magnetic field is incident on the second wire bond;
detecting the induced current using a sensing circuit; and
providing an elongated conducting element between the first wire bond and the second wire bond, wherein the elongated conducting element is grounded on one end so as to shield the second wire bond from an electric field generated from the first wire bond.

19. An isolation system, comprising:
a transmitter circuit, wherein the transmitter circuit is configured to generate a first current in accordance with a first signal;
a first elongated structure configured to receive the first current so as to generate a magnetic flux in accordance with the first current;
a second elongated structure for receiving the magnetic flux from the first elongated structure so as to generate an induced current;
a detector circuit that is electrically isolated from the transmitter circuit, wherein the detector circuit is configured to receive the induced current as input, and configured to generate a reproduced first signal, as an output of the detector circuit; and
a third elongated structure extending substantially in parallel with the first elongated structure and the second elongated structure, wherein the third elongated structure is grounded on one end so as to shield the second elongated structure from an electric field generated from the first elongated structure.

* * * * *